United States Patent
Tantolin et al.

(10) Patent No.: US 9,370,124 B2
(45) Date of Patent: Jun. 14, 2016

(54) COOLING AN ELECTRONIC DEVICE

(75) Inventors: Christian Tantolin, Lumbin (FR);
Claude Sarno, Etoile sur Rhone (FR)

(73) Assignee: Thales, Courbevoie (FR)

( * ) Notice: Subject to any disclaimer, the term of this patent is extended or adjusted under 35 U.S.C. 154(b) by 232 days.

(21) Appl. No.: 13/991,864

(22) PCT Filed: Dec. 16, 2011

(86) PCT No.: PCT/EP2011/073107
§ 371 (c)(1),
(2), (4) Date: Aug. 2, 2013

(87) PCT Pub. No.: WO2012/080493
PCT Pub. Date: Jun. 21, 2012

(65) Prior Publication Data
US 2013/0322024 A1    Dec. 5, 2013

(30) Foreign Application Priority Data

Dec. 17, 2010    (FR) ..................................... 10 04934

(51) Int. Cl.
*H05K 7/20*    (2006.01)

(52) U.S. Cl.
CPC .......... *H05K 7/2039* (2013.01); *H05K 7/20672* (2013.01)

(58) Field of Classification Search
CPC combination set(s) only.
See application file for complete search history.

(56) References Cited

U.S. PATENT DOCUMENTS

| 4,330,812 | A | * | 5/1982 | Token | 361/720 |
| 5,057,968 | A | * | 10/1991 | Morrison | 361/700 |
| 6,310,772 | B1 | * | 10/2001 | Hutchison et al. | 361/700 |
| 6,804,117 | B2 | * | 10/2004 | Phillips et al. | 361/700 |
| 6,972,365 | B2 | * | 12/2005 | Garner | 174/16.3 |
| 7,130,193 | B2 | * | 10/2006 | Hirafuji et al. | 361/700 |
| 7,193,850 | B2 | * | 3/2007 | Pal | 361/700 |
| 7,345,877 | B2 | * | 3/2008 | Asfia et al. | 361/700 |
| 7,349,221 | B2 | * | 3/2008 | Yurko | 361/719 |
| 7,397,662 | B2 | * | 7/2008 | Oyamada | 361/699 |
| 8,023,267 | B2 | * | 9/2011 | Streyle et al. | 361/707 |
| 2007/0265067 | A1 | | 11/2007 | Jiao et al. | |
| 2008/0019102 | A1 | | 1/2008 | Yurko | |
| 2008/0043442 | A1 | | 2/2008 | Strickland | |
| 2008/0218980 | A1 | * | 9/2008 | Tracewell et al. | 361/713 |

FOREIGN PATENT DOCUMENTS

| JP | 2009236934 A | 10/2009 |
| JP | 2010152772 A | 7/2010 |
| KR | 20040047346 A | 6/2004 |
| KR | 10-2011-0105195 A | 9/2011 |

* cited by examiner

*Primary Examiner* — Gregory Thompson
(74) *Attorney, Agent, or Firm* — Michael J. Donohue; Davis Wright Tremaine LLP

(57) ABSTRACT

The invention relates to the cooling of the item of electronic equipment comprising an electronic compartment formed from a housing and at least one electronic board assembled in the housing. The board is intended to be assembled in a removable manner in the housing by a movement of translation along a groove in order to reach an operating position, the assembly of the board (11) being carried out through an insertion face of the housing. According to the invention, the item of equipment comprises a heat sink of elongate shape disposed along the groove making it possible to collect the heat emitted by the components and means of extraction of the heat collected by the heat sink, the extraction means being located outside of the electronic compartment.

9 Claims, 3 Drawing Sheets

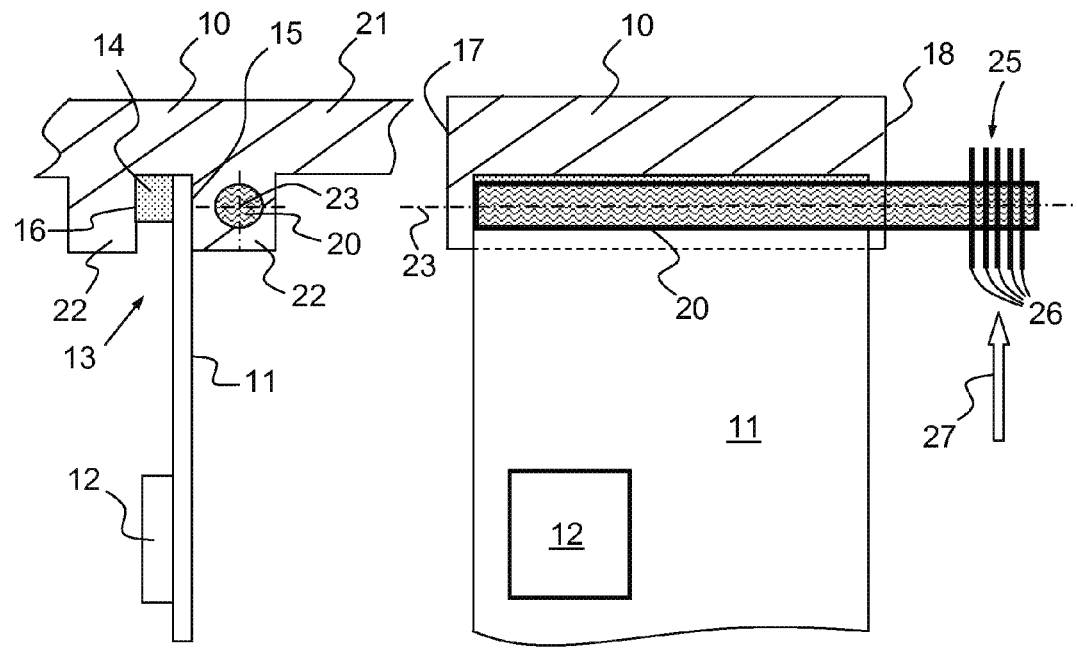
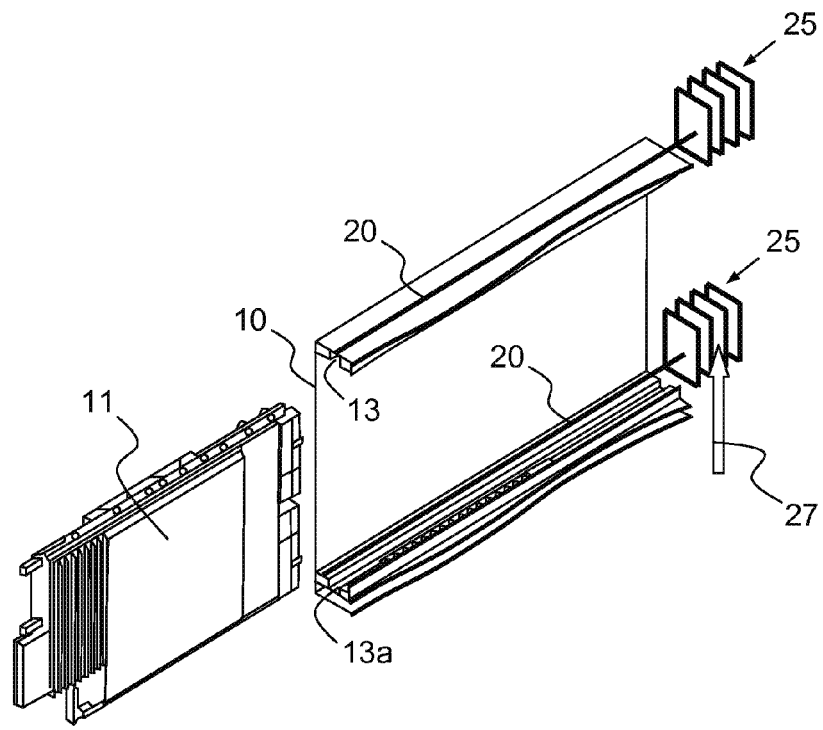

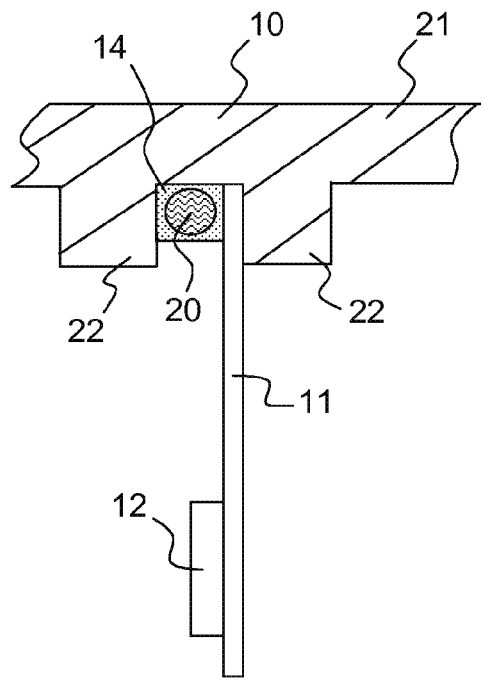
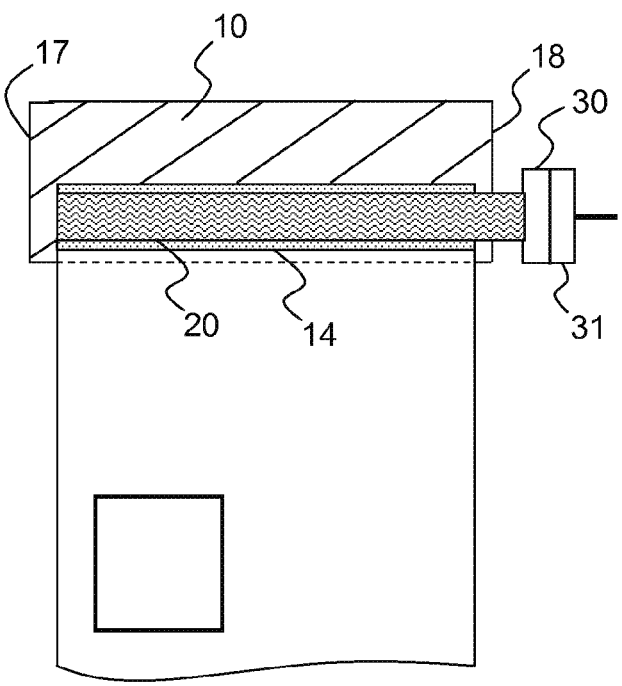
FIG.2a  FIG.2b
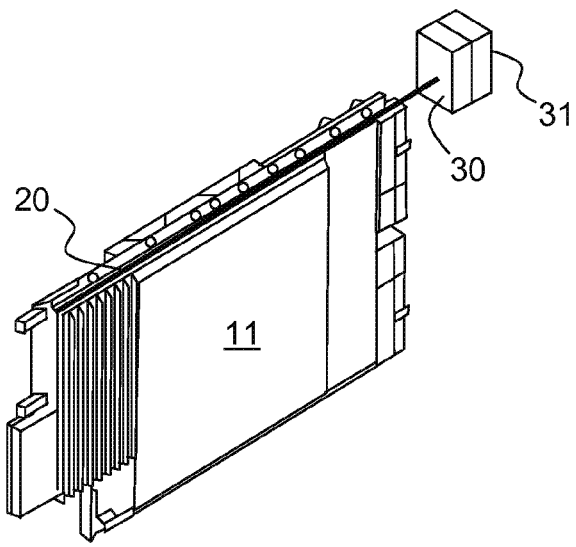
FIG.2c

COOLING AN ELECTRONIC DEVICE

FIELD OF THE INVENTION

The invention relates to the cooling of the item of electronic equipment comprising a housing and electronic boards plugged into the housing. The invention is particularly useful for on-board electronic equipment such as for example installed on board an aircraft.

BACKGROUND OF THE INVENTION

There are for example computers comprising several electronic boards assembled parallel with each other in a housing, also called a basket or rack. In order to ensure the maintenance of the equipment, the different boards can be disassembled. The assembly and disassembly of the boards is carried out by a movement of translation of the latter in grooves that are part of the housing.

The boards are formed of a printed circuit carrying electronic components. During their functioning, the electronic components release heat which has to be evacuated from the electronic equipment.

Several solutions have been considered for cooling electronic equipment. It is for example possible to cause a coolant fluid, such as air for example, to flow along the boards or in the immediate vicinity of the components and thus to cool them by forced convection.

It is also possible to equip the board to be cooled with a heat sink in the form of a plate made from a material having high thermal conductivity, such as copper or aluminum for example, the components being in contact with this sink. The plate has substantially the same area as the printed circuit and is parallel with the latter. This plate makes it possible to conduct the heat to be evacuated to the housing. The latter is therefore responsible for dissipating the collected heat to outside of the equipment. This dissipation can be obtained simply by making the housing from a material having high thermal conductivity or by placing a heat exchanger in the housing. For this purpose, it is possible to include channels in the housing through which flows, for example, air or water. It is therefore necessary to connect these channels to a cooling system outside of the equipment.

These solutions make it possible to cool the equipment in an overall manner but do not pay attention to possible hot spots, formed at the level of certain particular components. In order to keep these components at acceptable operating temperatures, it is necessary to increase the overall cooling of the equipment, for example by increasing the flow rates of the coolant fluids. This increases pressure drops in the cooling circuits beyond that which would be necessary for the overall cooling of the equipment.

In order to cool particular areas of boards, it is possible to place in direct contact with the component to be cooled an element, such as for example a heat pipe, making it possible to evacuate the heat by conduction directly at the level of the component. One end of the heat pipe is in contact with the component and the other end must allow the evacuation of the heat to outside of the equipment. The installation of this type of component makes the disassembly of the electronic boards more difficult.

In certain fields, notably in aeronautics, the replacement of electronic boards must be carried out quickly in order not to immobilize the carrier. It is therefore necessary to retain the same replacement time of a board, whether or not the latter is equipped with special cooling means.

SUMMARY OF THE INVENTION

One aim of the invention is to overcome all or some of the problems mentioned above by proposing the item of electronic equipment in which the boards are normally assembled by a movement of translation along grooves even in the presence of particular hot spots.

For this purpose, the invention relates to The item of electronic equipment comprising an electronic compartment formed from a housing and at least one board carrying electronic components, the board being intended for assembly in a removable manner in the housing by a movement of translation along a groove in order to reach an operating position, the assembly of the board being carried out through an insertion face of the housing, comprising a heat sink of elongate shape disposed along the groove making it possible to collect the heat emitted by the components and means of extraction of the heat collected by the heat sink, the extraction means being located outside of the electronic compartment, either at the level of the insertion face or at the level of a rear face opposite the insertion face.

In other words, the heat exchange principally occurs through one of the ends of the heat sink without passing through surfaces in contact between the heat sink and the groove.

The fact of using a heat sink of elongate shape disposed along the groove makes it possible to homogenize the temperature of the heat sink and to collect the heat produced in the board over the whole of the length of the groove and therefore over the largest possible contact area between the board and the housing.

BRIEF DESCRIPTION OF THE DRAWINGS

The invention will be better understood and other advantages will become apparent on reading the detailed description of an embodiment given by way of example with reference to the appended drawing in which:

FIGS. 1*a*, 1*b* and 1*c* show a first embodiment of The item of electronic equipment according to the invention;

FIGS. 2*a*, 2*b*, 2*c* and 2*d* show a second embodiment of The item of electronic equipment according to the invention.

For reasons of clarity, the same elements have the same references in the different figures.

DETAILED DESCRIPTION OF THE PREFERRED EMBODIMENTS

Figure 2D:
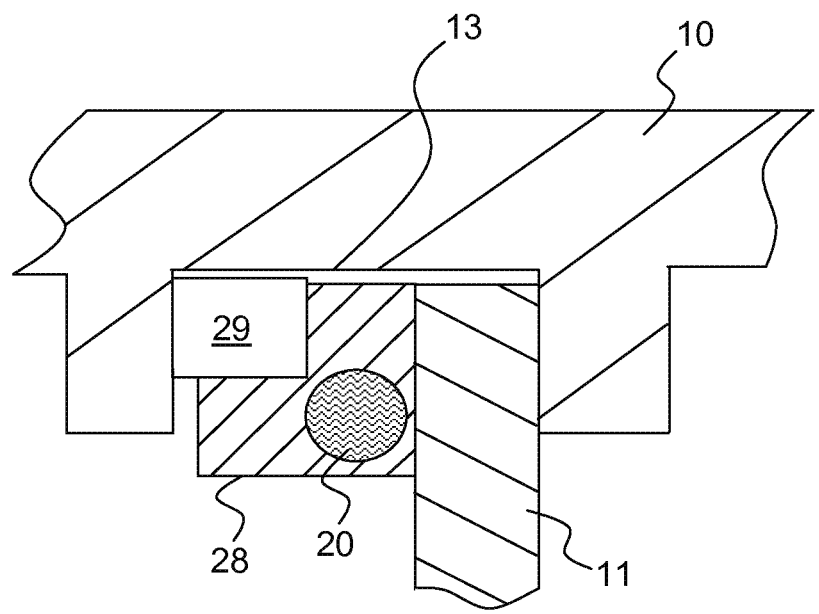

The different figures show The item of electronic equipment comprising a housing 10 containing several printed circuit boards, only one of which, referenced 11, has been shown in the drawing. On this board 11 numerous electronic components are installed only one of which, the component 12, is referenced here. This component requires particular cooling. It can be a power transistor of a digital circuit of the processor type.

The different boards are plugged into the housing 10 through its front face 17, or more generally through an insertion face. The electrical interconnections of the different boards are carried out at the back of the basket at the level of a face opposite to the insertion face, in the example shown, the rear face 18 of the housing 10. The boards are each guided in two opposite and parallel grooves. The plugging-in of a board is carried out by a movement of translation, in the grooves reserved for it, towards the back of the basket. The disassembly of the board is carried out very simply by a reverse movement of translation. It is therefore easy to replace a board in the case of malfunction of the latter. The expression "electronic compartment" refers to the assembly formed by the housing 10 and the plug-in board or boards 11. The equipment can comprise other assemblies fixed to the housing 10, such as a power supply for example.

FIGS. 1a, 1b and 1c show a first embodiment of the invention. More precisely, FIG. 1a shows, in partial cross-section seen through the front face 17 of the housing 10, the board 11 in one of its grooves 13. FIG. 1b shows a partial cross-sectional view of the board 11 in profile in the housing 10 and FIG. 1c shows in perspective the board 11 out of the housing 10.

The groove 13 is formed in the body of the housing 10 perpendicular to the front face 17 of the housing 10. A clamping device 14 makes it possible to press the board 11 against one of the faces 15 of the groove 13. The device 14 bears against a face 16 of the groove 13 opposite to the face 15. The board 11 is clamped between the clamping device 14 and the face 15.

The board 11 can comprise specific means intended to improve the thermal conduction between the component 12 and the groove 13. It can be a copper plate covered with an electrically insulating and thermally conductive paint disposed parallel with the printed circuit between the latter and the component 12. The copper plate is pierced at the pitch of the electronic components installed on the board 11 in order to allow the connection of the components to the printed circuit. The copper plate extends as far as the groove 13. The printed circuit can be interrupted before the groove 15. Thus, only the copper plate is clamped between the face 15 and the clamping device 14. This ensures good thermal contact between the copper plate and the housing 10. In this type of embodiment, the clamping device is often called a thermal retainer which can for example comprise several wedges that can be moved with respect to each other by means of a screw operated through the font face 17 of the housing 10.

According to the invention the item of electronic equipment comprises a heat sink 20 of elongate shape disposed along the groove 13 and making it possible to collect the heat emitted by the components of the board 11 in order to evacuate it towards a rear face 18 of the housing 10, the rear face 18 being opposite to the front face 17. The heat sink 20 is a component inserted in the housing 10. It has a thermal conductivity greater than that of the body of the housing 10 in which it is inserted. By using an inserted component there are fewer constraints on the thermal conductivity of the material forming the housing 10. It is for example possible to produce the housing 10 from a composite material which allows a substantial weight saving in comparison with a metal.

It is for example possible to use a diphasic sink such as a heat pipe or a diphasic loop or even a high thermal conductivity sink such as a bar made of graphite or diamond or one based on carbon nanotubes.

The heat sink 20 is associated with means of extracting the heat collected by the heat sink 20; the extraction means can be located at the level of the rear face 18 of the housing 10. The extraction means can also be placed at the level of the front face 17. The evacuation of the heat collected by the heat sink 20 is principally carried out by the extraction means, without passing through the housing 10.

When the equipment comprises several plug-in boards, each one of them in a pair of grooves, it is possible to associate with each groove a heat sink 20 and extraction means which are specific to each heat sink 20 and which are separate from each other. The different heat sinks 20 and extraction means are advantageously identical.

This allows better modularity of the invention which can be implemented in The item of equipment as needed. Certain boards can be equipped with a heat sink 20 and its own extraction means and others not. It is thus possible to modify an existing item of equipment at low cost without touching the housing 10 itself. This can be useful for example when replacing a board 11 with a new board having higher energy consumption and having to be cooled better. No heat sink was provided for the original board. Without modification of the housing 10, it is possible to add a heat sink 20 and its associated extraction means in order to accommodate the new board.

In the first embodiment of the invention, the heat sink 20 is integral with the housing 10. More precisely, the housing 10 comprises a plate 21 and a protrusion 22 protruding from the plate 21 and limited by the face 15 against which the board 11 bears. The plate 21 can comprise several protrusions 22 between which the grooves 13 are formed. The heat sink 20 is disposed in the protrusion 22. It extends along an axis 23 parallel with the plane of the board 11.

The heat sink 20 extends beyond the rear face 18 in order to form the extraction means 25. In FIG. 1b, the extraction means 25 comprise fins 26 integral with the heat sink 20. A flow of air 27 cools the fins 26 by forced convection in order to extract the heat collected by the heat sink 20 to outside of the equipment. Other alternatives can be envisaged for producing the extraction means 25, such as for example the use of a coolant liquid. More generally, the extraction means 25 make it possible to connect the heat sink to a cold source outside of the equipment. This cold source can be a mechanical element such as a metal frame supporting the housing 10 or the structure of the carrier in the case of an on-board item of equipment.

In the case where the heat sink 20 is diphasic, the part of the sink extending along the groove 13 forms an evaporator and the extraction means 25 form a condenser.

FIG. 1c shows two opposite grooves 13 and 13a allowing the board 11 to be plugged in. Depending on the need for cooling the board 11, it is possible to place a heat sink 20 along each groove 13 and 13a. In this case, each of the heat sinks 20 is extended by extraction means 25 which can be cooled by the same cold source formed by the flow of air 27 in the example shown.

In the second embodiment of the invention, shown by means of FIGS. 2a, 2b and 2c, the heat sink 20 is integral with the board 11. Thus, the different boards equipping a housing 10 can be equipped with a heat sink 20 or not according to the cooling requirements of the board 11. For example, in the case of hardware evolution in which a board must be replaced by a new and more recent board, even if the old board did not necessitate a heat sink, a new board which has to dissipate more heat can be accepted by equipping it with a heat sink. This evolution can be carried out without modification of the housing 10.

FIG. 2a shows, in partial cross-section seen through the front face 17 of the housing 10, the board 11 in one of its grooves, the groove 13. FIG. 2b shows a partial profile view of the board 11 in the housing 10 and FIG. 2c shows a perspective view of the board 11 in the housing 10.

In the second embodiment, the protrusion or protrusions 22 have the sole function of guiding the board 11. Advantageously, the heat sink 20 is produced in the clamping device 14. The clamping of the device 14 then provides good thermal contact between the board 11 and the heat sink 20.

FIG. 2d shows, in an enlarged view, an example of embodiment of the device 14 for clamping the board 11 in the groove 13. The device 14 comprises a bracket 28 extending along an edge of the board 11 and in which the heat sink 20 is disposed. The bracket 28 is made from a material having good thermal conductivity such as, for example, aluminum. Other materials having better thermal conductivity, such as copper, can be used. Aluminum however has the advantage of being lighter, which is an important advantage in an on-board aeronautical application. The device 14 also comprises a thermal retainer 29, for example having wedges providing the clamping function. The thermal retainer 29 is disposed in the recess of the bracket 28. It bears against the face 16 of the groove 13 in order to apply a clamping force towards the face 15 of the groove 13. The bracket 28 is fixed to the board 11 and the thermal retainer 29 is fixed to the bracket.

The heat sink 20 is coupled with the extraction means 25 which in this embodiment comprise a thermal connector 30 making it possible to connect the heat sink 20 to a cold source 31 outside of the equipment. An example of a thermal connector 30 is described in the patent application published under the reference number FR 2 920 949. The cold source can, as in the first embodiment, be formed by fins 26 or by any other means making it possible to cool the heat sink 20. The thermal connection function can also be provided by the electrical connector of the board situated at the back of the basket. This connector coupled with the connector of the basket makes it possible to delimit an air channel through which can be made to flow air that is colder or having higher pressure with respect to the ambient environment.

A thermal connector 30 can be used in the first embodiment.

A single heat sink 20 has been shown in FIG. 2c. It is of course possible to equip the board 11 with two heat sinks 20 each associated with their own extraction means 25, as shown in FIG. 1c.

The invention claimed is:

1. The item of electronic equipment comprising an electronic compartment formed from a housing and at least one board carrying electronic components, the board being intended for assembly in a removable manner in the housing by a movement of translation along a groove in order to reach an operating position, the assembly of the board being carried out through an insertion face of the housing, further comprising a heat sink of elongate shape mounted on the board and disposed along the groove making it possible to collect the heat emitted by the components and means of extraction of the heat collected by the heat sink, the extraction means being located outside of the electronic compartment, either at the level of the insertion face or at the level of a rear face opposite the insertion face.

2. The item of electronic equipment as claimed in claim 1, comprising several boards each assembled in a removable manner in the housing by a movement of translation along a groove in order to reach an operating position and comprising several identical heat sinks, each associated with a groove and with its own extraction means.

3. The item of electronic equipment as claimed in claim 1, further comprising an additional heat sink mounted on the housing.

4. The item of electronic equipment as claimed in claim 3, wherein the heat sink is a component inserted in the housing and in that the heat sink has thermal conductivity greater than that of the housing.

5. The item of electronic equipment as claimed in claim 3, the housing comprising a plate and a protrusion protruding from the plate, against which protrusion bears the board and in that the heat sink is disposed in the protrusion.

6. The item of electronic equipment as claimed in claim 1, comprising a bracket fixed to the board and a thermal retainer fixed to the bracket, the heat sink being disposed in the bracket and the thermal retainer ensuring the pressing of the board against a face of the groove.

7. The item of electronic equipment as claimed in claim 1, wherein the extraction means comprise a thermal connector making it possible to connect the heat sink to a cold source outside of the equipment.

8. The item of electronic equipment as claimed in claim 1, wherein the extraction means are located at the level of the rear face.

9. The item of electronic equipment as claimed in claim 1, further comprising an additional groove spaced apart from and parallel to the groove, and an additional heat sink mounted on the board spaced apart from and parallel to the heat sink, the additional heat sink being disposed along the additional groove making it possible to collect the heat emitted by the components.

* * * * *